(12) United States Patent
Tseng et al.

(10) Patent No.: US 8,922,242 B1
(45) Date of Patent: Dec. 30, 2014

(54) SINGLE EVENT UPSET MITIGATION

(71) Applicant: Xilinx, Inc., San Jose, CA (US)

(72) Inventors: Chen W. Tseng, Longmont, CO (US); Weiguang Lu, San Jose, CA (US); Karthy Rajasekharan, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/185,587

(22) Filed: Feb. 20, 2014

(51) Int. Cl.
*H03K 19/007* (2006.01)
*H03K 19/177* (2006.01)

(52) U.S. Cl.
CPC .............................. *H03K 19/17764* (2013.01)
USPC ..................................... 326/38; 326/14; 326/9

(58) Field of Classification Search
USPC ................. 326/9, 10, 14, 37, 38, 46
See application file for complete search history.

(56) References Cited

U.S. PATENT DOCUMENTS

| 8,099,625 | B1* | 1/2012 | Tseng et al. ..................... 714/15 |
| 8,549,379 | B2* | 10/2013 | Rodriguez et al. ............ 714/763 |
| 2005/0027409 | A1* | 2/2005 | Marshall et al. ................ 701/13 |
| 2007/0176627 | A1* | 8/2007 | Ng et al. .......................... 326/14 |
| 2007/0198892 | A1* | 8/2007 | Ng et al. ......................... 714/763 |
| 2007/0260939 | A1* | 11/2007 | Kammann et al. .............. 714/48 |

* cited by examiner

*Primary Examiner* — Don Le
(74) *Attorney, Agent, or Firm* — LeRoy D. Maunu

(57) ABSTRACT

Methods and circuits are disclosed for backing up the value of a bi-stable circuit included in a set of programmable logic circuits of a programmable IC. The programmable logic circuits are configured to implement logic circuits having functions based on data values stored in a used portion of a plurality of configuration memory cells. The programmable IC includes a backup control circuit configured to back up and restore the value of the bi-stable circuit. In response to a first signal, a first data value stored by the bi-stable circuit is retrieved and stored in a first one of the plurality of configuration memory cells that is unused in implementing the logic circuits. In response to a second signal, the first data value is retrieved from the first one of the plurality of configuration memory cells and stored in the bi-stable circuit.

20 Claims, 4 Drawing Sheets

SINGLE EVENT UPSET MITIGATION

TECHNICAL FIELD

The disclosure generally relates to the detection and correction of single event upsets such as those induced in a programmable integrated circuit.

BACKGROUND

Programmable integrated circuits (ICs), such as field programmable gate arrays (FPGAs), are user configurable ICs capable of implementing various digital logic operations. FPGAs include programmable logic circuits such as configurable logic blocks (CLBs) arranged in rows and columns, input/output blocks (IOBs) surrounding the CLBs, and programmable interconnect lines that extend between the rows and columns of CLBs. The CLBs, IOBs, and interconnect lines are configured to implement a particular design according to configuration data stored in configuration memory of the programmable IC.

The versatility of programmable ICs is advantageous in applications, such as those requiring high availability, high reliability, or functional safety, where remote reconfiguration is preferred over physical replacement. However, with shrinkage of device geometry, atmospheric radiation such as neutrons can cause an error in bi-stable circuits known as a single event upset (SEU). When a single heavy ion strikes a silicon substrate, it loses energy through the creation of free electron hole pairs. This results in a dense ionized track in the local region, generating a current pulse that can upset the circuit. This is known as a single event upset (SEU) or soft error. An SEU can also be caused by alpha particles. Alpha particles are generated when a neutron strikes a silicon substrate. The alpha particles travel through the substrate and generate charge clusters within a limited silicon volume. Alpha particles can be generated from high energy neutrons as well as neutrons that have lost enough kinetic energy to be at thermal equilibrium with the operating environment. Alpha particles can also be generated through the decay of semiconductor packages that contain a small amount of radioactive contaminants.

In a programmable IC, an SEU may induce errors in configuration memory cells used to configure programmable logic circuits to perform specific functions, thereby changing the configuration of a user circuit design implemented by the programmable logic circuits. An SEU may additionally or alternatively induce errors by changing the value of a bi-stable circuit (e.g., a flip flop or latch) included in a user circuit design that is implemented by the programmable logic circuits. For ease of reference, an error induced in configuration memory by an SEU may be referred to as a configuration upset. An error induced in a bi-stable circuit of a user circuit design may be referred to as a logic upset.

Generally, logic upsets induced by SEU are mitigated by implementing three redundant copies of a circuit along with a majority voter to ensure that a correct value is output while a logic upset occurs in one of the redundant copies. This is known as triple modular redundancy (TMR). However, TMR increases both resource requirements and power consumption of a circuit threefold.

SUMMARY

A programmable IC is disclosed. The programmable IC includes a plurality of configuration memory cells and a plurality of programmable logic circuits. At least one of the plurality of logic circuits includes a bi-stable circuit. The programmable logic circuits are configured to implement logic circuits having functions based on data values stored in a used portion of the plurality of configuration memory cells. The programmable IC also includes a backup control circuit configured to back up and restore the value of the bi-stable circuit. In response to a first signal, a first data value stored by the bi-stable circuit is retrieved and stored in a first one of the plurality of configuration memory cells that is unused in implementing the logic circuits. In response to a second signal, the first data value is retrieved from the first one of the plurality of configuration memory cells and stored in the bi-stable circuit.

A method of operating a programmable IC is also disclosed. In response to a first signal, a first data value stored by a bi-stable circuit included in a set of programmable logic circuits of the programmable IC is retrieved. The retrieved data value is stored in a first one of a plurality of configuration memory cells of the programmable IC that is unused. In response to a second signal, the first data value is retrieved from the first one of the plurality of configuration memory cells and the bi-stable circuit is set to the first data value.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION

A logic upset occurs in a programmable IC when an SEU changes the state of a bi-stable circuit included in a circuit design implemented by programmable logic circuits of the programmable IC. Circuits and methods are disclosed for mitigating logic upsets by storing a backup data value of a bi-stable circuit in an unused portion of configuration memory of a programmable IC. If logic upset is detected, the back-up data value may be retrieved from configuration memory and used to restore a bi-stable circuit to its previous state.

In one example implementation, a programmable IC includes a backup control circuit configured to back up and restore values of one or more bi-stable circuits of a circuit design implemented by programmable logic circuits of the programmable IC. The programmable logic circuits of the programmable IC are configured to implement a logic circuit whose function is based on values stored in a configuration memory of the programmable IC. The backup control circuit is configured to back up and restore values of a bi-stable circuit included in the logic circuit using an unused portion of the configuration memory. For instance, in some implementations, the backup control circuit is configured to retrieve a first data value stored by the bi-stable circuit in response to a first signal. The backup control circuit stores the retrieved first data value in an unused portion of the configuration memory. In response to a second signal, the backup control circuit retrieves the first data value from the configuration memory and stores the retrieved first data value back in the bi-stable circuit.

The disclosed circuits and methods may be used to back up values stored by a number of different bi-stable circuits of a circuit design including, for example, latches, flip-flops, and/or memory cells. While embodiments are not so limited, for ease of explanation, the disclosed examples are primarily discussed with reference to mitigating logic upsets of flip-flops of a circuit design implemented in a programmable IC.

Figure 1:
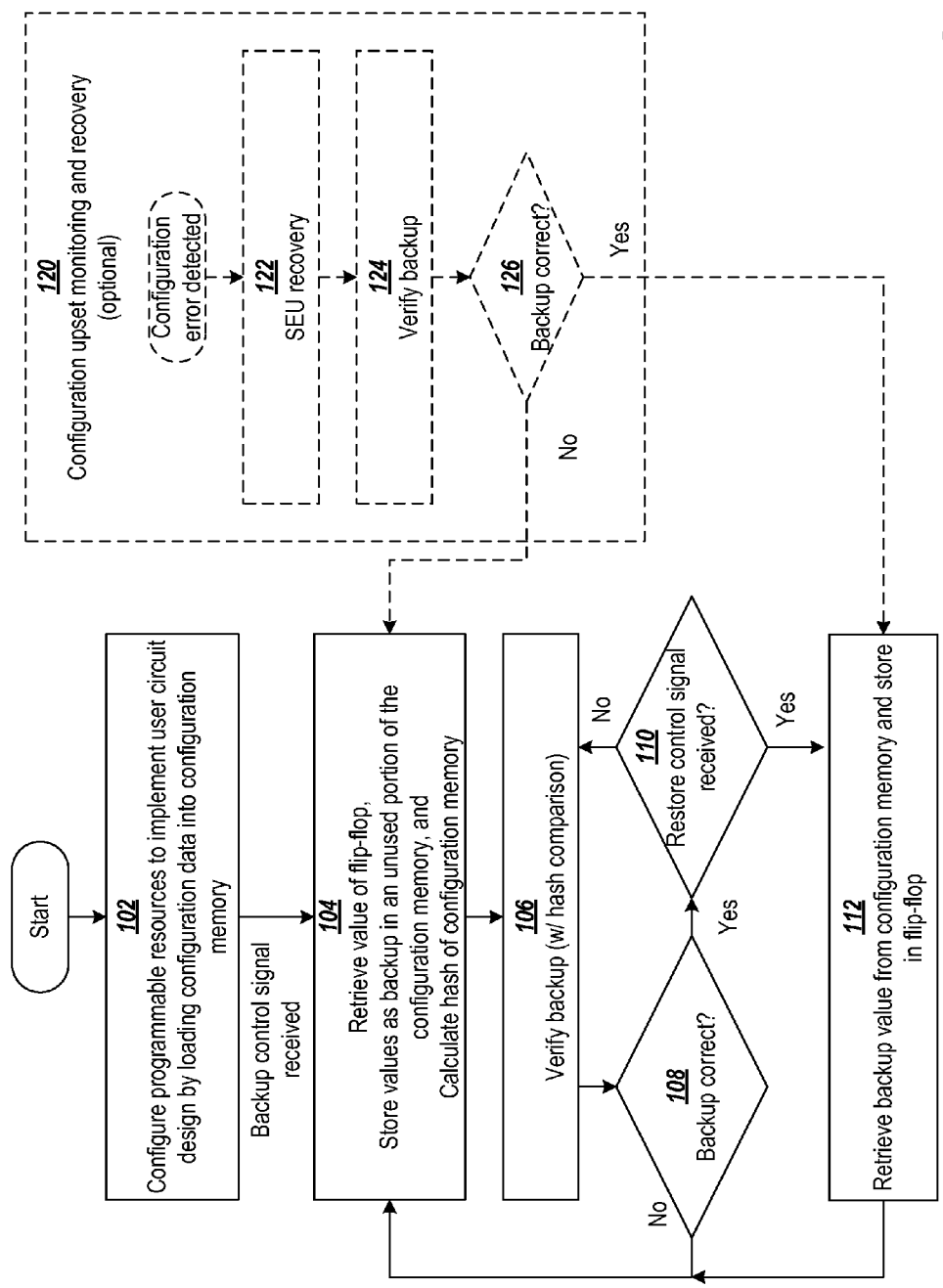
FIG. 1 shows a process for backing up and restoring a value of a flip-flop in a programmable IC.

Turning now to the figures, FIG. 1 shows a process for backing up and restoring a value of a flip-flop in a programmable IC. At block 102, programmable logic circuits of a programmable IC are configured to implement a user circuit design by loading configuration data into configuration memory. In response to receiving a first signal (backup cmd) from the user circuit design, the value of a flip-flop is retrieved at block 104 and stored in a portion of the configuration memory that is not being used to configure programmable logic circuits of the programmable IC. A hash or checksum may optionally be calculated at block 104 for the portion of configuration memory used for backup. The hash or checksum may be used in subsequent verification of the backup data values to determine if the backup values have changed.

The backup values stored in the configuration memory may be periodically checked to verify that the backup values have not been corrupted. In this example, the backup value is verified at block 106. Verification may be performed, for example, by calculating a hash or checksum value from the values in the portion of configuration memory used for backup and comparing the result with the hash or checksum value previously computed at block 104. If the compared hash/checksum values are different, the backup value(s) is corrupt. If the backup value has been corrupted, decision block 108 directs the process to again retrieve the value of the flip-flop and store the retrieved value in the configuration memory at block 104. Otherwise, if the backup value has not been corrupted and a restore control signal is received, decision block 110 directs the process to retrieve the backup value from the configuration memory at block 112 and store the retrieved value into the flip-flop of the user circuit design.

In some implementations, the portion of configuration memory used to configure programmable logic resources may be monitored for SEUs, as shown by optional process 120 in FIG. 1. If an SEU is detected in the configuration memory (configuration upset), SEU recovery is performed at block 122 to correct upsets in the configuration memory. Following SEU recovery, the process 120 verifies the backup value stored in configuration memory at block 124. If the backup value is not correct, decision block 126 directs the process to again retrieve the value of the flip-flop and store the retrieved value in the configuration memory at block 104. If the backup value is correct, decision block 126 directs the process to retrieve the backup value from the configuration memory at block 112 and store the retrieved value into the flip-flop of the user circuit design.

Figure 2:
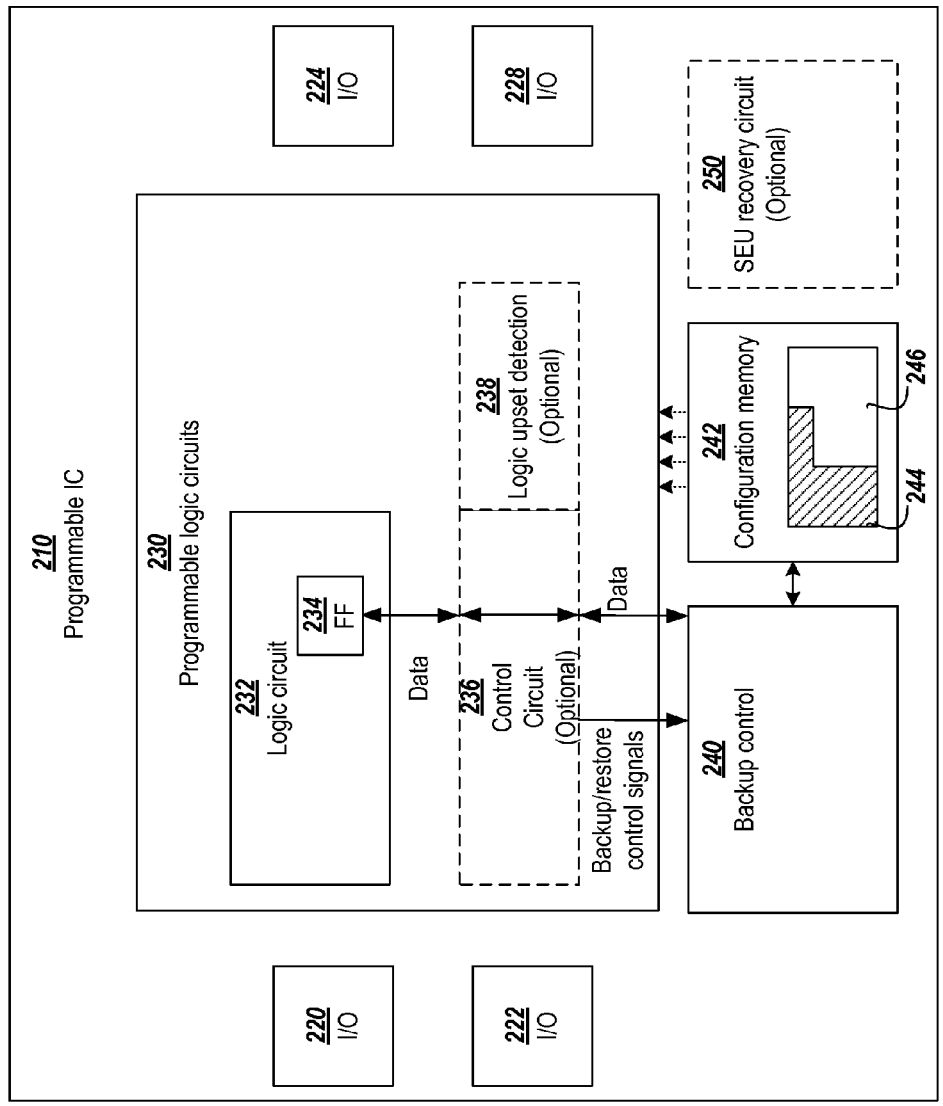
FIG. 2 shows a programmable IC including a backup control circuit configured to back up and restore values of a circuit implemented by the programmable IC.

FIG. 2 shows a programmable IC including a backup control circuit configured to back up and restore a value of a bi-stable circuit implemented by the programmable IC. The programmable IC 210 includes a configuration memory 242 and a plurality of programmable logic circuits 230 configured to implement various logic circuits having functions that are based on the data values stored in a portion of the configuration memory 242. The programmable IC also includes input/output (I/O) circuits 220, 222, 224, and 228 that may be used to communicate data to and from circuits implemented by the programmable logic circuits 230. In this example, the programmable logic circuits 230 are configured to implement a logic circuit 232 with flip-flop 234, control circuit 236 and logic upset detection circuit 238. Configuration data causing the programmable logic circuits 230 to implement these circuits is stored in a first portion 244 of the configuration memory 242.

The programmable IC 210 includes a backup control circuit 240 configured to back up and restore a data value of the flip-flop 234 using a second portion 246 of the configuration memory 242 that is not used for configuration of the programmable logic circuits 230. In some implementations, in response to receiving a backup control signal, the backup control circuit 240 retrieves the first data value stored by the flip-flop 234 and stores the first data value in the unused portion of the configuration memory 242. In response to a restore control signal, the backup control circuit 240 retrieves the first data value from the configuration memory 242 and stores the retrieved data value in the flip-flop 234 of the logic circuit 232.

In this example, the backup and restore control signals are provided to the backup control circuit 240 by a control circuit 236 implemented in the programmable logic circuits 230 of the programmable IC 210. The control circuit 236 may be configured, for example, to restore the state of the flip-flop 234 following a logic upset by providing the restore control signal to the backup control circuit 240. Optionally, the control circuit 236 includes a detection circuit 238 to detect upset of the logic circuit 232.

In some implementations, programmable IC 210 also includes an SEU recovery circuit 250. The SEU recovery circuit 250 is configured to detect and recover from SEUs in the configuration memory 242. As described with reference to process 120 in FIG. 1, in response to SEU recovery circuit 250 correcting an upset in configuration memory 242, the backup control circuit 240 may be prompted to determine whether or not the backup value has been corrupted. If the backup value is not correct, the backup control circuit 240 may again retrieve the value of the flip-flop 234 and store the retrieved value in the configuration memory 242. If the backup value is correct, the backup control circuit 240 may use the backup value to restore the value of the flip-flop 234, if required.

The backup control is configured to store the data value in memory cells of the configuration memory 242 that will not affect operation of circuits (232, 236, and 238) implemented by the programmable logic circuits 230. This can be accomplished, for example, by selecting a memory cell for backup that controls a programmable circuit that is not used by or connected to the circuits 232, 236, or 238. For instance, memory cells that control configuration of unused programmable logic circuits may be used for storing backup values if interconnect resources of the programmable logic circuits 230 are configured to isolate the unused programmable logic blocks from other programmable logic circuits.

In some implementations, the bi-stable circuits to be backed up and the memory cells of configuration memory used for storing backup data values may be specified by a designer or determined during placement and routing of a circuit design. A configuration data stream (e.g., a bitstream) used to program configuration memory of a programmable IC may also include data bits that configure the backup control circuit 240 to back up the specified/determined bi-stable circuits using the specified/determined memory cells of the configuration memory. In some other implementations, the backup control may dynamically determine which memory cells can be used for storing backup values during runtime operation and maintain a map of memory cells to bi-stable circuits.

As indicated above, a backup value stored in configuration memory is used to restore the state of a bistable circuit of a user design in response to receiving a restore control signal from the user design or external controller. It is understood that there is an insignificant chance for the restore control signal to be mistriggered. However, this probability (error) outweighs the probability of logic upsets to critical components in the design that cannot recover if upset.

Figure 3:
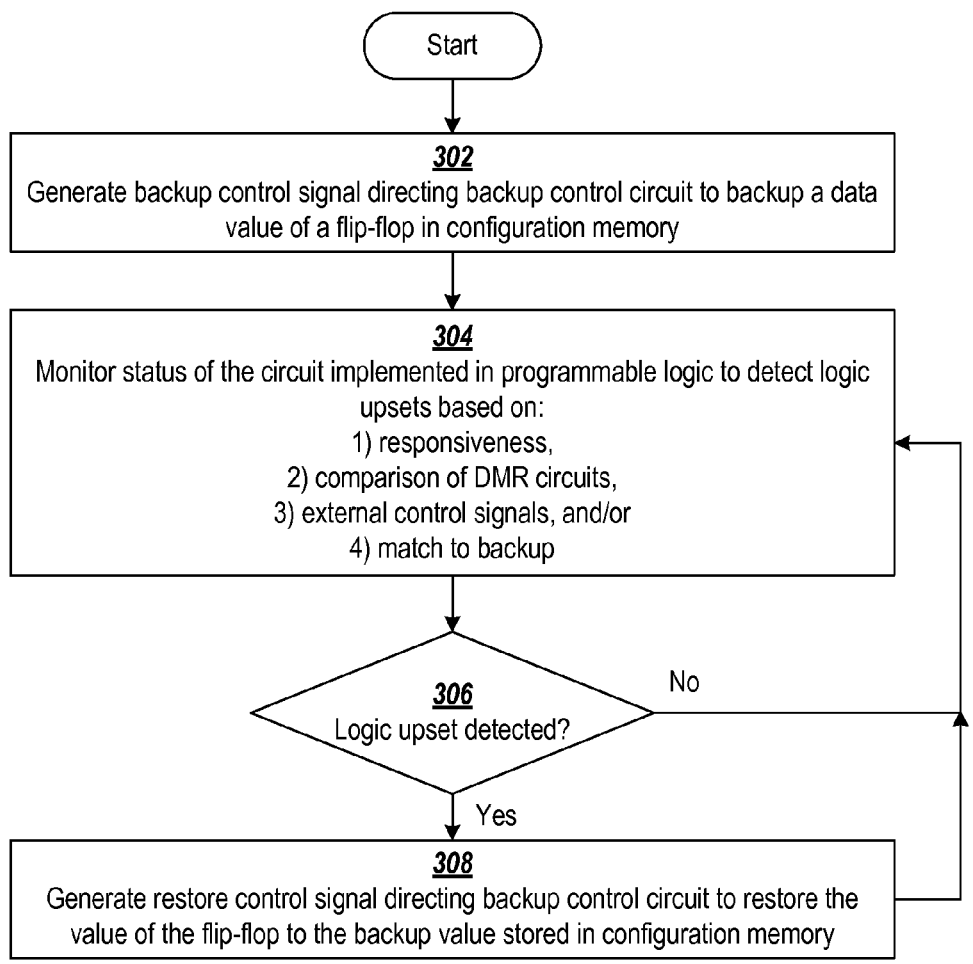
FIG. 3 shows a process for sampling and restoring the state of a circuit implemented by a programmable IC based on the status of the circuit.

FIG. 3 shows a process for sampling and restoring the state of a circuit implemented by a programmable IC based on the status of the circuit. The process may be performed, for example, by control circuit 236 in FIG. 2. At block 302, a first control signal is generated that directs a backup control circuit to back up a data value stored in a flip-flop of a circuit implemented in programmable logic. At block 304, the status of the circuit is monitored to detect upsets to a logic circuit.

Logic upsets may be detected at block 304 based on a combination of criteria or single events or states. For example, in some implementations, a logic upset may be detected by sampling and comparing data values of two redundant copies of circuits implemented in the logic circuit. This is referred to as double modular redundancy (DMR). If the two redundant circuits have different values, a logic upset is detected.

As another example, logic upsets may be detected by monitoring the logic circuit to detect when it has become unresponsive. If the logic circuit becomes unresponsive, a logic upset is detected. In some implementations, responsiveness of the logic circuit may be monitored locally by a detection circuit in the programmable IC (e.g., by logic upset detection circuit 238). Alternatively or additionally, responsiveness may be monitored by an external circuit communicatively coupled to the programmable IC. The external circuit may provide an error signal to an input (e.g., I/O circuit 222) of the programmable IC when an unresponsive state is detected.

As another example, logic upsets may be detected by comparing the value of the flip-flop with a backup value stored in configuration memory. In order to detect logic upset based on such a comparison, the backup value must first be verified to ensure that it is correct. As discussed with reference to FIG. 1, verification of the backup value may be performed using hashes. Other criteria may additionally or alternatively be used to detect when a logic upset has occurred.

If a logic upset is detected at decision block 306, a second control signal is generated at block 308 that directs the backup control circuit to restore the flip-flop to the backup data value stored in configuration memory. In some implementations, other remedial measures may also be taken in response to detecting a logic upset. For example, in response to a logic upset, a reset of one or more circuits may be triggered, or an alert signal may be provided to an external circuit connected to the programmable IC.

Figure 4:
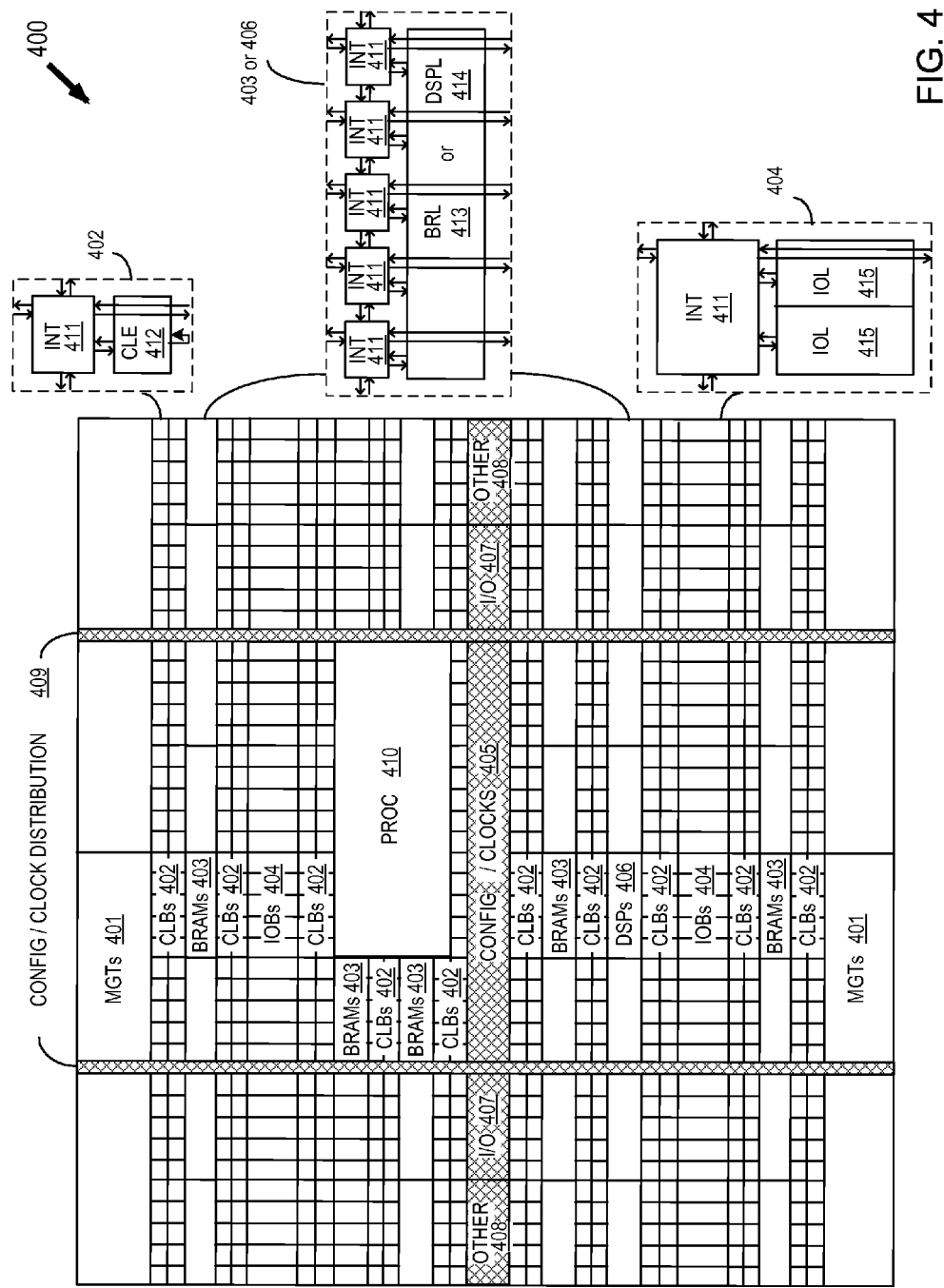
FIG. 4 is a block diagram of a programmable integrated circuit, which may be configured to back up and restore values of a circuit implemented by the programmable IC.

FIG. 4 is a block diagram of a programmable integrated circuit, specifically a field programmable gate array (FPGA), which may be configured to back up and restore values of a circuit implemented by the programmable IC. FPGAs can include several different types of programmable logic blocks in the array. For example, FIG. 4 illustrates an FPGA architecture (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), a reconfiguration port (not shown), specialized input/output blocks (I/O 407), for example, e.g., clock ports, and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the height of the tile. In the pictured implementation, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured implementation, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic.

The present invention is thought to be applicable to a variety of systems and circuits for SEU mitigation. Other aspects and embodiments of the present invention will be apparent to those skilled in the art from consideration of the specification and practice of the invention disclosed herein. It is intended that the specification and illustrated embodiments be considered as examples only, with a true scope of the invention being indicated by the following claims.

What is claimed is:

1. A programmable integrated circuit (IC), comprising:
a plurality of configuration memory cells;
a plurality of programmable logic circuits, at least one of the plurality of programmable logic circuits including a bi-stable circuit;
wherein the programmable logic circuits are configured to implement logic circuits having functions based on data values stored in a used portion of the plurality of configuration memory cells; and
a backup control circuit configured to:
in response to a first signal, retrieve a first data value stored by the bi-stable circuit and store the first data value in a first one of the plurality of configuration memory cells that is unused in implementing the logic circuits; and
in response to a second signal, retrieve the first data value from the first one of the plurality of configuration memory cells and store the retrieved first data value in the bi-stable circuit.

2. The programmable IC of claim 1, wherein the backup control circuit is further configured to:
monitor the first data value stored in the first one of the plurality of configuration memory cells; and
in response to the first data value stored in the first one of the plurality of configuration memory cells becoming corrupted, retrieve a second data value stored by the bi-stable circuit and store the second data value in the first one of the plurality of configuration memory cells.

3. The programmable IC of claim 1, further comprising:
a single event upset (SEU) recovery circuit configured to detect and correct upsets of the plurality of configuration memory cells; and
wherein the backup control circuit is further configured to, in response to the SEU recovery circuit correcting an upset of a second one of the plurality of configuration memory cells:
determine whether or not the first data value stored in the first one of the plurality of configuration memory cells is corrupt; and
in response to determining that the first data value stored in the first one of the plurality of configuration memory cells is corrupt, retrieve a second data value stored by the bi-stable circuit and store the second data value in the first one of the plurality of configuration memory cells.

4. The programmable IC of claim 3, wherein in response to the SEU recovery circuit correcting an upset of the plurality of configuration memory cells, the backup control circuit is further configured to:
in response to determining that the first data value stored in the first one of the plurality of configuration memory cells is not corrupt, retrieve the first data value from the first one of the plurality of configuration memory cells and store the retrieved first data value in the bi-stable circuit.

5. The programmable IC of claim 1, wherein the logic circuits include a first logic circuit that accesses the bi-stable circuit, and a control circuit configured to:
provide the first signal to the backup control circuit to prompt the backup control circuit to retrieve the first data value stored in the bi-stable circuit and store the first data value in the first one of the plurality of configuration memory cells;
monitor the status of the first logic circuit; and
in response to detecting a logic upset in the first logic circuit, provide the second signal to the backup control circuit.

6. The programmable IC of claim 5, wherein the control circuit is configured to detect logic upsets in the first logic circuit by detecting when the first logic circuit has become unresponsive.

7. The programmable IC of claim 5, wherein:
the first logic circuit is implemented using first and second redundant circuits; and
the control circuit is configured to detect logic upsets in the first logic circuit by determining whether or not the value of a first flip flop in the first redundant circuit is equal to a value of a second bi-stable circuit in the second redundant circuit.

8. The programmable IC of claim 1, wherein the logic circuits include a first logic circuit that accesses the bi-stable circuit, and a control circuit configured to:
provide the first signal to the backup control circuit to prompt the backup control circuit to retrieve the first data value stored in the bi-stable circuit and store the first data value in the first one of the plurality of configuration memory cells; and
in response to an error signal, provide the second signal to the backup control circuit.

9. The programmable IC of claim 8, wherein the first one of the plurality of configuration memory cells used to store the first data value is configured so functionality of the first logic circuit and the control circuit is not disrupted by storing the first data value.

10. The programmable IC of claim 1, wherein the bi-stable circuit comprises a flip-flop.

11. A method of operating a programmable integrated circuit (IC), comprising:
in response to a first signal, retrieving a first data value stored in a bi-stable circuit included in a set of programmable logic circuits of the programmable IC and store the first data value in a first one of a plurality of configuration memory cells of the programmable IC that is unused; and
in response to a second signal, retrieving the first data value from the first one of the plurality of configuration memory cells and set the bi-stable circuit to the first data value.

12. The method of claim 11, further comprising:
monitoring the first data value stored in the first one of the plurality of configuration memory cells; and
in response to the first data value stored in the first one of the plurality of configuration memory cells becoming corrupted, retrieving a second data value stored in the bi-stable circuit and storing the second data value in the first one of the plurality of configuration memory cells.

13. The method of claim 11, further comprising:
detecting and correcting an upset of the plurality of configuration memory cells; and
in response to the correcting of the upset of the plurality of configuration memory cells:
determining whether or not the first data value stored in the first one of the plurality of configuration memory cells is corrupt; and
in response to determining that the first data value stored in the first one of the plurality of configuration memory cells is corrupt, retrieving a second data value stored in the bi-stable circuit and storing the second data value in the first one of the plurality of configuration memory cells.

14. The method of claim 13, further comprising, in further response to the correcting of the upset of the plurality of configuration memory cells and determining that the first data value stored in the first one of the plurality of configuration memory cells is not corrupt:
- retrieving the first data value from the first one of the plurality of configuration memory cells; and
- storing the retrieved first data value in the bi-stable circuit.

15. The method of claim 11, further comprising using a control circuit implemented in the set of programmable logic circuits to generate the first and second signals.

16. The method of claim 11, further comprising:
- detecting a logic upset in the bi-stable circuit; and
- in response to detecting a logic upset in the bi-stable circuit, generating the second signal.

17. The method of claim 16, wherein the detecting of the logic upset in the bi-stable circuit includes comparing a value of the bi-stable circuit to a redundant copy of the bi-stable circuit.

18. The method of claim 16, wherein the detecting of the logic upset in the bi-stable circuit includes determining whether or not a logic circuit including the bi-stable circuit has become unresponsive.

19. The method of claim 11, wherein the bi-stable circuit comprises a flip-flop.

20. The method of claim 11, further comprising:
- configuring the set of programmable logic circuits using configuration data stored in the plurality of configuration memory cells.

\* \* \* \* \*